(12) United States Patent
Leussler

(10) Patent No.: US 7,538,552 B2
(45) Date of Patent: May 26, 2009

(54) ORTHOGONAL COIL FOR MAGNETIC RESONANCE IMAGING

(75) Inventor: Christoph G. Leussler, Hamburg (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 5 days.

(21) Appl. No.: 11/814,115

(22) PCT Filed: Jan. 5, 2006

(86) PCT No.: PCT/IB2006/050041

§ 371 (c)(1),
(2), (4) Date: Jul. 17, 2007

(87) PCT Pub. No.: WO2006/090293

PCT Pub. Date: Aug. 31, 2006

(65) Prior Publication Data

US 2008/0129294 A1    Jun. 5, 2008

Related U.S. Application Data

(60) Provisional application No. 60/646,468, filed on Jan. 24, 2005.

(51) Int. Cl.
*G01V 3/00* (2006.01)
(52) U.S. Cl. .................. 324/318; 324/322
(58) Field of Classification Search ......... 324/300–322; 600/407–422; 335/296, 297
See application file for complete search history.

(56) References Cited

U.S. PATENT DOCUMENTS

| | | | |
|---|---|---|---|
| 4,746,866 A | 5/1988 | Roschmann | |
| 5,543,711 A | 8/1996 | Srinivasan et al. | |
| 5,557,247 A | 9/1996 | Vaughn | |
| 5,917,324 A | 6/1999 | Leussler | |
| 6,535,084 B1 | 3/2003 | Tropp | |
| 6,798,202 B2 | 9/2004 | Savelainjen | |
| 6,825,660 B2 | 11/2004 | Boskamp | |
| 6,992,486 B2 * | 1/2006 | Srinivasan | 324/318 |
| 7,180,291 B2 * | 2/2007 | Chmielewski et al. | 324/318 |
| 7,298,145 B2 * | 11/2007 | Neufeld et al. | 324/318 |
| 7,343,194 B2 * | 3/2008 | Ferris et al. | 600/415 |
| 7,495,443 B2 * | 2/2009 | Leussler et al. | 324/318 |
| 2003/0122546 A1 | 7/2003 | Leussler | |

(Continued)

FOREIGN PATENT DOCUMENTS

DE    10109489 A1    11/2001

(Continued)

OTHER PUBLICATIONS

Alecci, M., et al.; Characterization and Reduction of Gradient-Induced Eddy Currents in the RF Schield of a TEM Resonator; 2002; MRM; 48:404-407.

(Continued)

*Primary Examiner*—Brij B Shrivastav

(57) ABSTRACT

A radio frequency coil assembly (32) for magnetic resonance imaging includes a coil array portion (60, 60', 88) and a TEM coil portion (62, 62'). The coil array portion includes a plurality of decoupled coil loops (70, 70', 90). The TEM coil portion includes a plurality of rods (72, 72') coupled with a radio frequency screen (34, 34'). Each rod of the TEM coil portion is electromagnetically orthogonal to a corresponding coil loop of the coil array portion.

21 Claims, 6 Drawing Sheets

U.S. PATENT DOCUMENTS

| | | | |
|---|---|---|---|
| 2005/0275403 A1* | 12/2005 | Pinkerton et al. | 324/318 |
| 2008/0054904 A1* | 3/2008 | Neufeld et al. | 324/322 |
| 2008/0061785 A1* | 3/2008 | Soutome et al. | 324/319 |
| 2008/0129298 A1* | 6/2008 | Vaughan et al. | 324/322 |
| 2008/0180101 A1* | 7/2008 | Bradshaw et al. | 324/318 |
| 2008/0197848 A1* | 8/2008 | Zhai et al. | 324/318 |

FOREIGN PATENT DOCUMENTS

| | | | |
|---|---|---|---|
| WO | 02095435 A1 | 11/2002 |
| WO | 2004048987 A2 | 6/2004 |
| WO | 2005050237 A1 | 6/2005 |

OTHER PUBLICATIONS

Vaughan, J. T., et al.; Efficient High-Frequency Body Coil for High-Field MRI; 2004; MRM; 52:851-859.

* cited by examiner

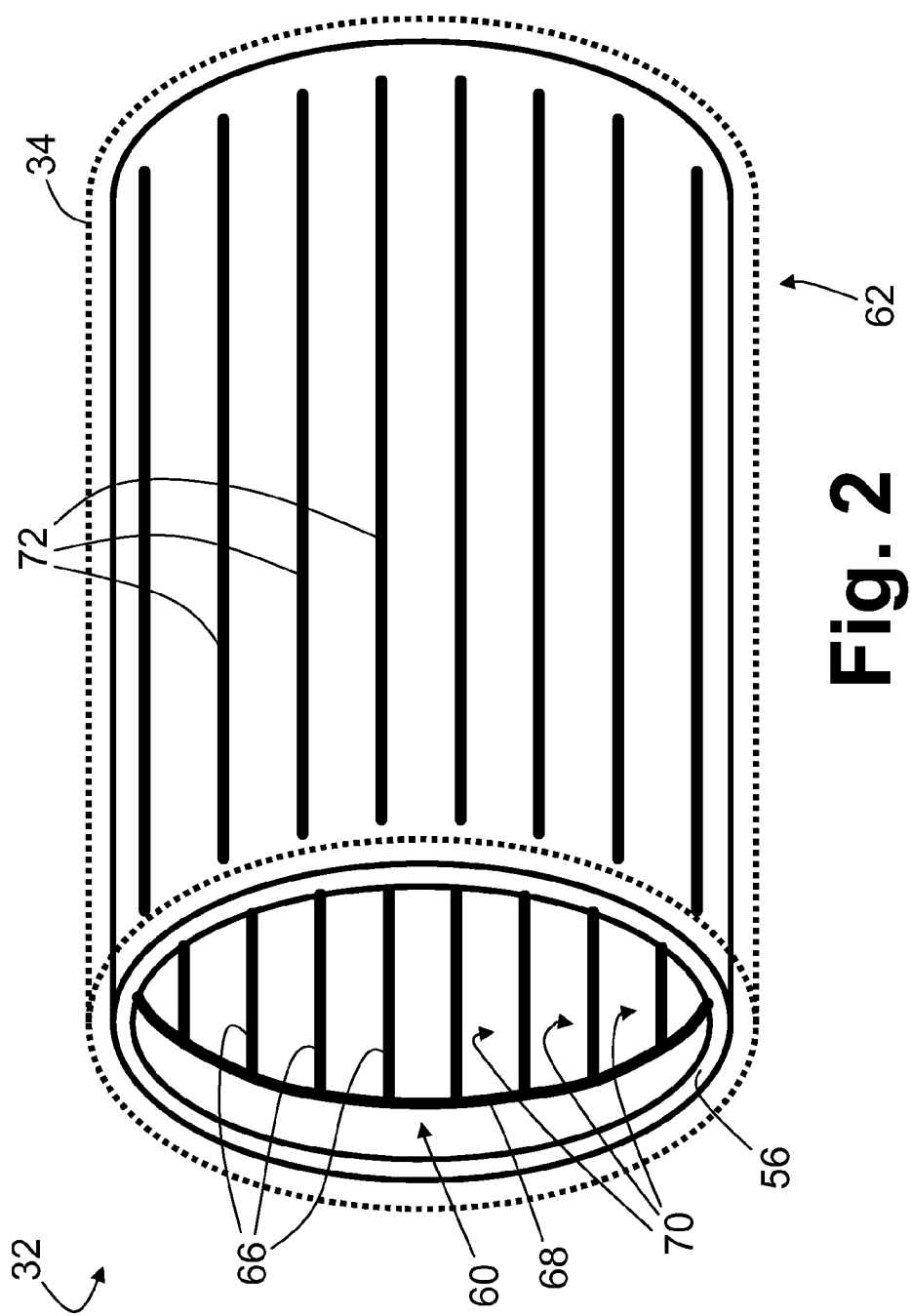

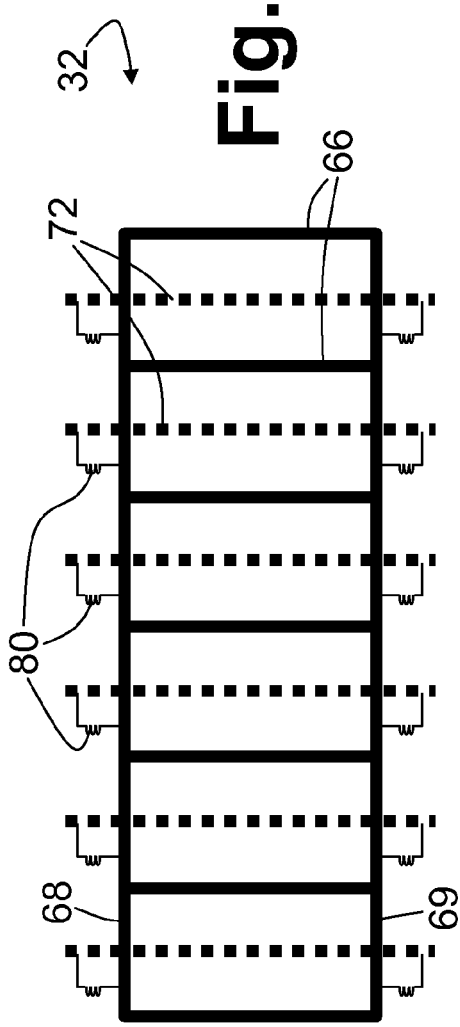
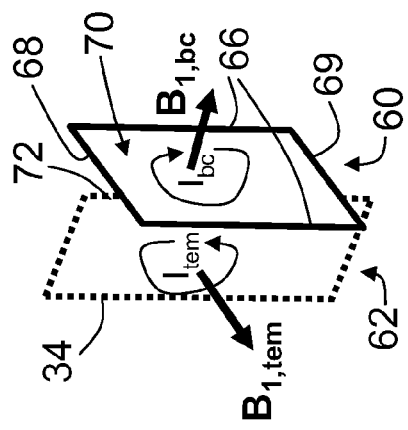

ORTHOGONAL COIL FOR MAGNETIC RESONANCE IMAGING

DESCRIPTION

The following relates to the magnetic resonance arts. It finds particular application in magnetic resonance imaging employing receive coil arrays, transmit coil arrays, transmit/receive coil arrays, different transmit and receive coils, shimmed radio frequency coils, and so forth, and will be described with particular reference thereto. More generally, it finds application in conjunction with substantially any type of magnetic resonance operation, such as magnetic resonance imaging, magnetic resonance spectroscopy, and so forth.

The advent of high field magnetic resonance imaging has motivated development of new radio frequency coil designs which are able to provide functionality such as radio frequency shimming and multiple frequency operation. Coil arrays are also of interest, in which a phased array of coil elements are controlled in phase and amplitude.

One coil suitable for such applications is the degenerate birdcage coil. By suitable selection of loop and rung capacitance ratios, the mesh loops of the degenerate birdcage coil are electrically decoupled from one another, producing an array of independently operable coil loops. Similarly, a transverse electromagnetic (TEM) coil can be configured to provide independently operable rod resonators. These coil arrays can be used for producing homogeneous $B_1$ radio frequency electromagnetic fields, for performing multi-coil reception methods such as phased coil array reception, sensitivity encoded (SENSE) reception, and so forth.

However, existing coils have certain disadvantages. The degenerate birdcage coils, TEM coils, and the like are difficult to employ for both transmit and receive phases of the imaging sequence. The mesh loops or rods of the coil are substantially decoupled in the degenerate configuration; however, the large voltages are induced during the transmit phase, and these large induced voltages can couple with the receive coil elements and interfere with the receive phase of the imaging sequence, or can even damage the receive coils or associated receive electronics.

Another problem with existing coils is that the $B_1$ field produced or received by degenerate birdcage and TEM coils can exhibit substantial non-uniformities at the ends of the coil, especially when operated at relatively high magnetic field.

The following contemplates improved apparatuses and methods that overcome the aforementioned limitations and others.

According to one aspect, a radio frequency coil for magnetic resonance imaging is disclosed. A coil array portion includes a plurality of decoupled coil loops. A TEM coil portion includes a plurality of rods coupled with a radio frequency screen. Currents in each rod of the TEM coil portion are electromagnetically orthogonal to currents in a corresponding coil loop of the coil array portion.

According to another aspect, a radio frequency system is disclosed for use in magnetic resonance, including a radio frequency transmitter, a radio frequency receiver, and a radio frequency coil. The radio frequency coil includes a coil array portion and a TEM coil portion. The coil array portion includes a plurality of decoupled coil loops. The TEM coil portion includes a plurality of rods coupled with a radio frequency screen. Each rod of the TEM coil portion is electrically orthogonal to a corresponding coil loop of the coil array portion. The radio frequency transmitter is coupled with one of the coil array portion and the TEM coil portion. The radio frequency receiver is coupled with one of the coil array portion and the TEM coil portion.

According to another aspect, a magnetic resonance imaging system is disclosed. A main magnet produces a main magnetic field in an examination region. Magnetic field gradient coils superimpose selected magnetic field gradients on the main magnetic field in the examination region. A radio frequency transmitter and a radio frequency receiver are provided. A radio frequency coil includes a coil array portion and a TEM coil portion. The coil array portion includes a plurality of decoupled coil loops. The TEM coil portion includes a plurality of rods coupled with a radio frequency screen. Each rod of the TEM coil portion is electrically orthogonal to a corresponding coil loop of the coil array portion. The radio frequency transmitter is coupled with one of the coil array portion and the TEM coil portion. The radio frequency receiver is coupled with one of the coil array portion and the TEM coil portion.

One advantage resides in providing an integrated transmit/receive coil array with substantially reduced inter-coil element coupling during the transmit phase.

Another advantage resides in providing a coil capable of simultaneously operating at multiple frequencies to perform simultaneous imaging at multiple Larmor frequencies.

Another advantage resides in a degenerate birdcage or TEM coil with improved radio frequency shimming.

Yet another advantage resides in providing one or more of the above advantages in a compact and readily manufactured coil design.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system employing a radio frequency coil having orthogonal coils array and TEM coil portions.

FIG. 2 shows a perspective view of one embodiment of the radio frequency coil of FIG. 1, in which the coils array portion is embodied as a degenerate birdcage coil portion.

FIG. 4A shows via a planar layout representation the relative geometric arrangement of the degenerate birdcage and TEM coil portions of the radio frequency coil of FIG. 2.

FIG. 4B shows a perspective diagrammatic view of one of the rod resonators of the TEM coil portion of the radio frequency coil of FIG. 2, including the return path provided by the radio frequency screen, and the corresponding mesh loop of the degenerate birdcage coil. FIG. 4B illustrates the geometric orthogonality of these resonator elements.

In FIG. 5, an array portion of physically separate and overlapping coil loops is also used in place of the degenerate birdcage coil portion of the radio frequency coil of FIG. 2.

Figure 1:
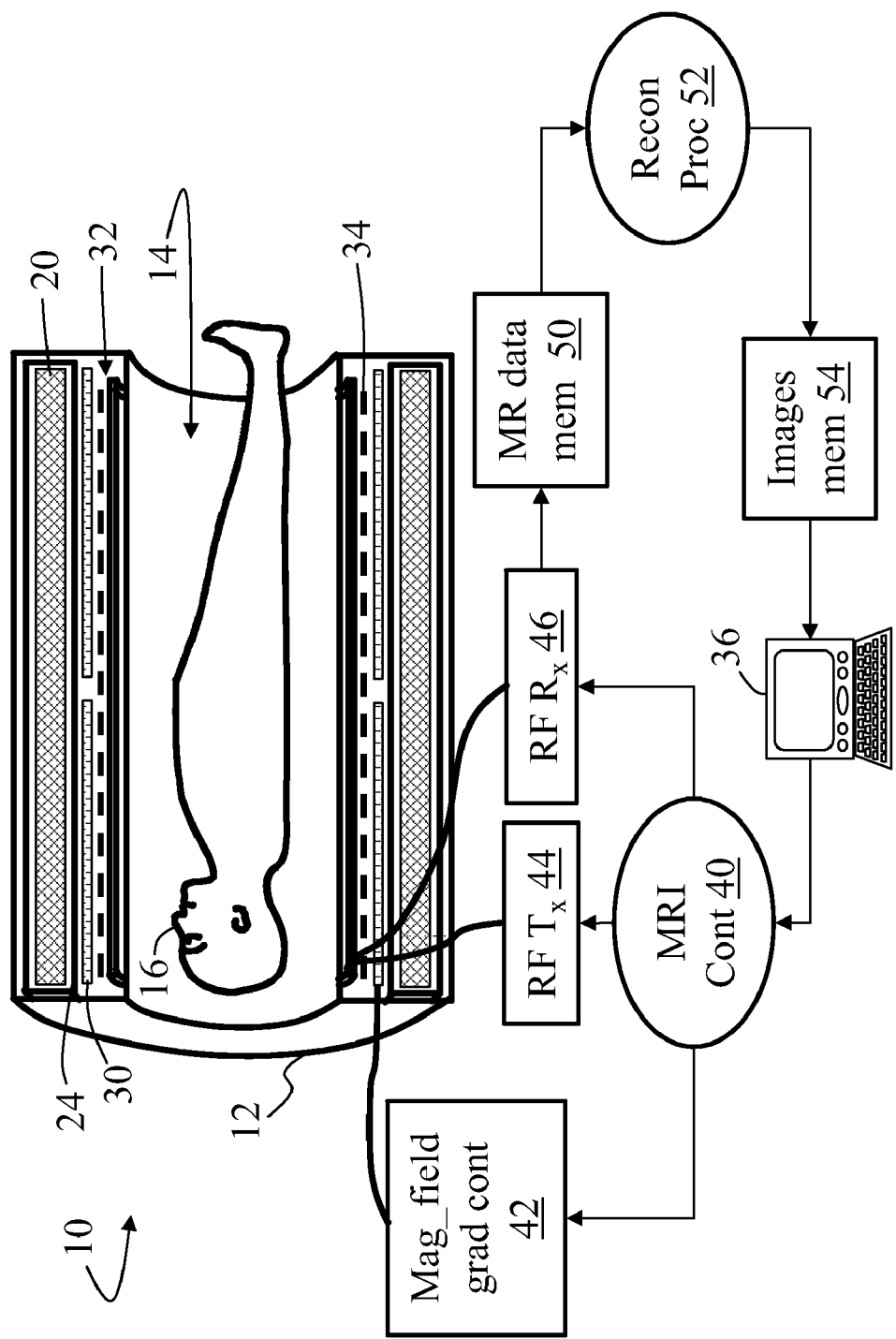

With reference to FIG. 1, a magnetic resonance imaging scanner 10 includes a housing 12 defining an examination region 14 in which is disposed a patient or other imaging subject 16. A main magnet 20 disposed in the housing 12 generates a main magnetic field in the examination region 14.

Typically, the main magnet 20 is a superconducting magnet surrounded by cryoshrouding 24; however, a resistive main magnet can also be used. Magnetic field gradient coils 30 are arranged in or on the housing 12 to superimpose selected magnetic field gradients on the main magnetic field within the examination region 14. Typically, the magnetic field gradient coils include coils for producing three orthogonal magnetic field gradients, such as x-gradients, y-gradients, and z-gradients. A radio frequency coil assembly 32 including a radio frequency screen 34 is arranged in or on the housing 12 to inject radio frequency excitation pulses into the examination region 14.

A user interface 36 is used by a technician, radiologist, or other user to select a magnetic resonance imaging pulse sequence that is executed by a magnetic resonance imaging controller 40 that operates: magnetic field gradient controllers 42 coupled to the gradient coils 30; a radio frequency transmitter 44 coupled to the radio frequency coil assembly 32; and a radio frequency receiver 46 coupled with the coil assembly 32. Magnetic resonance is generated by radio frequency excitation produced by the cooperating transmitter 44 and coil assembly 32, and the magnetic resonance is spatially encoded by the cooperating magnetic field gradient coils 30 and gradient controllers 42. The magnetic resonance signals are received by the radio frequency receiver 46, and are stored in a magnetic resonance data memory 50. A reconstruction processor 52 reconstructs the stored magnetic resonance data into a reconstructed image using a Fourier transform reconstruction technique or other suitable reconstruction technique. The reconstructed image is stored in an images memory 54, and can be displayed on the user interface 36, transmitted over a local area network or the Internet, printed by a printer, or otherwise utilized. In some embodiments, a separate user interface with high resolution monitor is provided for displaying or otherwise manipulating the images.

The magnetic resonance imaging system of FIG. 1 is an illustrative example. In general, substantially any magnetic resonance imaging scanner can incorporate the radio frequency coils disclosed herein. For example, the scanner can be a vertical bore scanner, a low-field scanner, a high-field scanner, or so forth. Moreover, although shown as separate components in FIG. 1 for illustrative purposes, it will be appreciated that various components such as the user interface 36, controller 40, and so forth may be integrated with one another or otherwise arranged. Still further, while a whole body coil assembly 32 is illustrated, it is to be appreciated that the radio frequency coils disclosed herein are applicable to other types of coils such as head coils, torso coils, leg coils, and so forth.

With reference to FIG. 2, the example radio frequency coil assembly 32 includes a generally cylindrical dielectric former 56 having a degenerate birdcage coil portion 60 disposed on an inner surface of the dielectric former 56 and a TEM coil portion 62 disposed on an outer surface of the dielectric former 56. The radio frequency screen 34 is cylindrical and surrounds the dielectric former 56. In FIG. 2, the radio frequency screen 34 is drawn in phantom to reveal the interior components.

Figure 3A:
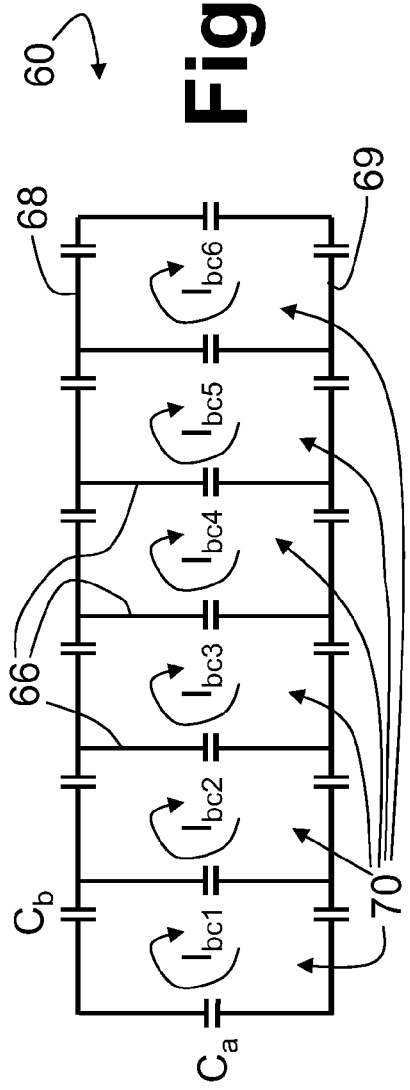
FIGS. 3A and 3B show planar layout representations of the degenerate birdcage and TEM coil portions, respectively, of the radio frequency coil of FIG. 2.

With continuing reference to FIG. 2 and with further reference to FIG. 3A, the degenerate birdcage coil portion 60 includes a plurality of parallel rungs 66 and two transverse end-rings 68, 69. The rungs have a rung capacitance $C_a$ while the transverse elements 68, 69 have transverse capacitances $C_b$. The capacitance ratio $C_a/C_b$ is selected such that the birdcage coil portion 60 is a degenerate birdcage coil in which each pair of neighboring rungs 66, together with the portions of the transverse elements 68, 69 between those neighboring rungs, define a birdcage mesh loop 70 that is substantially decoupled from the other birdcage mesh loops 70 of the birdcage coil portion 60. In FIG. 3A, the resonances of the birdcage mesh loops 70 are identified by corresponding mesh currents $I_{bc1}$, $I_{bc2}$, $I_{bc3}$, $I_{bc4}$, $I_{bc5}$, and $I_{bc6}$. Since the birdcage mesh loops 70 are substantially decoupled from one another, the birdcage mesh loops 70 can be operated independently of one another to define a phased array of receive coil loops, a transmit coil, or so forth. In effect, the degenerate birdcage coil portion 60 defines a coil array portion including the plurality of decoupled coil loops 70. In some embodiments, the coil loops are physically separate, rather than being arranged as a degenerate birdcage coil portion. For example, the degenerate birdcage coil portion 60 can be replaced by a coil array portion including a plurality of overlapping, physically separate, decoupled coil loops (for example, see FIG. 5).

Figure 3B:
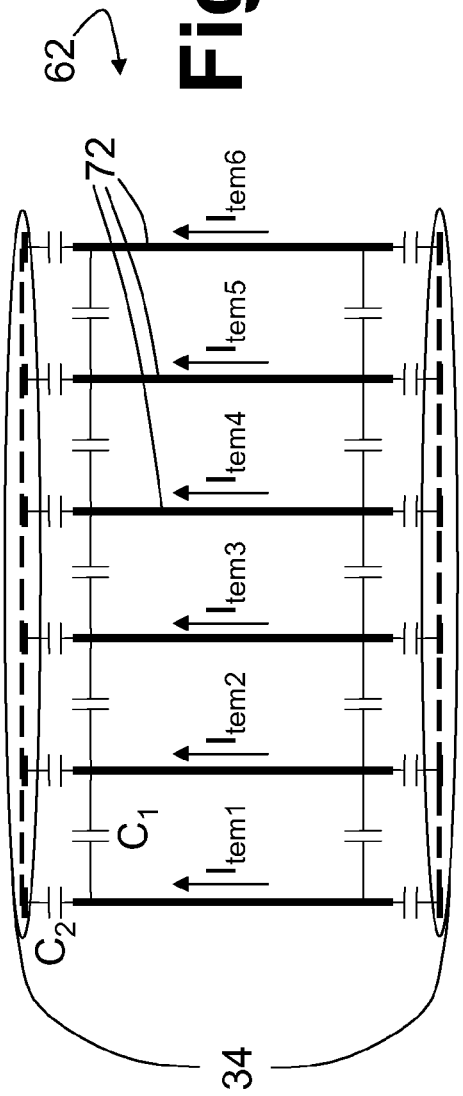

With continuing reference to FIG. 2 and with further reference to FIG. 3B, the TEM coil 62 includes a plurality of rods 72 arranged generally parallel with the rungs 66 of the degenerate birdcage coil portion 60. The TEM coil portion 62 also includes the radio frequency screen 34. The radio frequency screen 34 can be supported by a separate dielectric former (not shown), or can be a free-standing conductive cylinder, or can be disposed on the dielectric former 56 on top of the rods 72 and separated therefrom by an insulating layer (not shown), or so forth. The ends of the rods 72 are coupled with the radio frequency screen 34 by rod-to-screen capacitances $C_2$, and are also coupled to neighboring rods by rod-to-rod capacitances $C_1$. The capacitances $C_1$, $C_2$ are selected such that each of the rods 72 acts as a resonator that is decoupled from the other rods. The rod resonances are denoted by corresponding rod currents $I_{tem1}$, $I_{tem2}$, $I_{tem3}$, $I_{tem4}$, $I_{tem5}$, and $I_{tem6}$. The return paths for these resonance currents is through the radio frequency screen 34. Since the rod resonances are substantially decoupled from one another, the rods can be operated independently of one another to define a phased array of receive coils, a transmit coil, or so forth.

With continuing reference to FIGS. 2, 3A and 3B, and with further reference to FIGS. 4A and 4B, each of the rods 72 of the TEM coil portion 62 is arranged between two neighboring rungs 66 of a corresponding coil mesh 70 of the degenerate birdcage coil portion 60. The TEM rods and the birdcage rungs are positioned to minimize interaction which in many embodiments is achieved by centering the TEM rods 72 between adjacent birdcage rungs 66. In diagrammatic FIGS. 4A and 4B, components of the TEM coil portion 62 are drawn using dotted lines, while components of the degenerate birdcage coil portion 60 are drawn using solid lines. The radio frequency screen 34 is omitted in FIG. 4A and is shown diagrammatically as a return current path in FIG. 4B. Capacitance symbols are omitted in both FIGS. 4A and 4B. The resonance of the rod 72 carrying current $I_{tem}$ is electrically orthogonal to the corresponding resonance of the birdcage mesh loop 70 carrying the current $I_{bc}$. As best seen in FIG. 4B, this electrically orthogonal arrangement causes a $B_{1,tem}$ field produced or detected by the rod 72 to be orthogonal to a $B_{1,bc}$ field produced or detected by the corresponding mesh loop 70. The orthogonality ensures that the rod and mesh loop resonances are substantially decoupled from one another.

In some embodiments, the coil array defined by the birdcage coil portion 60 can be used as a receiver array, while the TEM coil portion 62 can be used as a transmitter array. Due to the orthogonality of the $B_{1,bc}$ and $B_{1,tem}$ fields, coupling is substantially reduced for the integrated transmit/receive array defined by the radio frequency coil assembly 32. Because the rods 72 of the TEM coil portion are connected with the radio frequency screen 34, it is typically convenient to design the radio frequency coil with the birdcage coil portion 60 inside of the TEM coil portion 62, as illustrated. The inner degenerate birdcage coil portion 60, being closer to the examination region 14 than the TEM coil portion 62, is then preferred for use as the receive coil array. However, in other embodiments it is contemplated to have the TEM coil portion serve as the receiver array and the birdcage coil portion serve as the transmitter array. In some embodiments, the transmit coil array (either the TEM coil portion or the degenerate birdcage coil portion) is used for transmit sensitivity encoding (SENSE).

In some embodiments, the birdcage coil portion 60 and the TEM coil portion 62 are tuned at different frequencies. For example, in some embodiments the degenerate birdcage coil portion 60 is tuned to a first magnetic resonance frequency and the TEM coil portion 62 is tuned to a second magnetic resonance frequency different from the first magnetic resonance frequency. The first and second magnetic resonance frequencies can, for example, be tuned to a $^1H$ magnetic resonance frequency, a $^{13}C$ magnetic resonance frequency, a $^{15}N$ magnetic resonance frequency, a $^{19}F$ magnetic resonance frequency, or so forth, thus enabling simultaneous imaging of two different species of nuclei.

The decoupling of the rods 72 and mesh loops 70 facilitates using one for radio frequency shimming of the other. For example, in the illustrated coil 32, the rods 72 are longer than the rungs 66, and the TEM coil portion 62 can be used to radio frequency shim the degenerate birdcage coil portion 60. Alternatively, the degenerate birdcage coil portion can be used to shim the TEM coil portion.

With brief returning reference to FIGS. 4A and 4B, the geometric orthogonality of the rod resonators and corresponding birdcage mesh loop resonators (best seen in FIG. 4B) produces substantial decoupling of these resonators. However, in some cases there may be some residual coupling, for example due to imperfect geometric orthogonality, asymmetries in the resonators, or so forth. Optionally, decouplers 80 (shown in FIG. 4A) such as the illustrated inductors, or transformers, impedance networks, or so forth, are connected between the degenerate birdcage coil portion 60 and the TEM coil portion 62. The decouplers 80 compensate for residual stray coupling between the degenerate birdcage coil portion 60 and the TEM coil portion 62.

Figure 5:
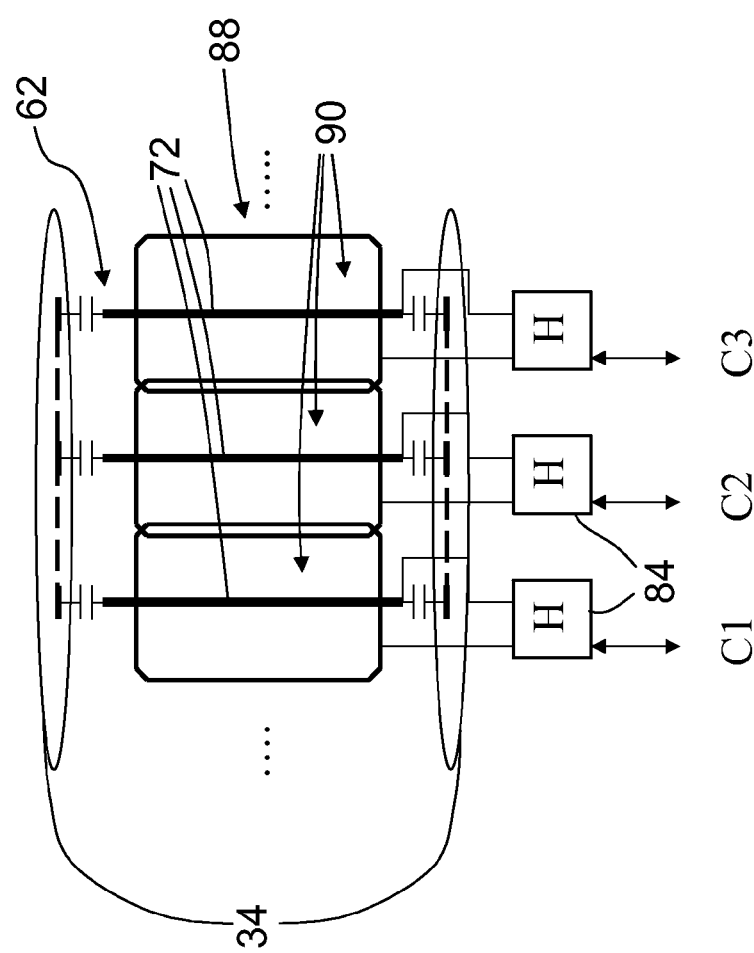
FIG. 5 shows one approach for electrically connecting the radio frequency coil using hardware combiners.

With reference to FIG. 5, the coil array portion and TEM coil portion can be combined as a hybrid (0°-90°) quadrature array using hardware combiners 84. In FIG. 5, an array portion 88 of physically separate and overlapping coil loops 90 is substituted for the degenerate birdcage coil portion 60. Each of the coil loops 90 is arranged geometrically orthogonal to the rod resonance of a corresponding rod of the TEM coil portion 62. Although the array portion 88 of overlapping separate coil loops 90 is shown in FIG. 5, the hybrid quadrature array arrangement with hardware combiners 84 can also be constructed using the degenerate birdcage coil portion 60.

At high frequencies, the circular polarization may be degraded in the imaging subject 16 due to dielectric effects. To compensate for this, the phase setting for each rod 72 or coil loop 90 is suitably selected based on the location of that coil loop or rod. One application of quad arrangements such as that shown in FIG. 5 is body imaging at high magnetic field strengths. In some embodiments, the transmit array is defined by the TEM coil portion 62, and the receive array is defined by the degenerate birdcage coil portion 60 or by the array portion 88. Due to orthogonality between the TEM coil portion 62 and the degenerate birdcage coil portion 60 or array portion 88, the individual coil elements are decoupled, and the transmit field induces only low voltages in the receive elements. The receiving degenerate birdcage coil portion 60 or array portion 88 are advantageously positioned at a smaller inner diameter of the scanner bore than the transmitting TEM coil portion 62 to provide good receive sensitivity and to mitigate specific absorption ration (SAR) during the transmit phase. A higher signal-to-noise ratio (SNR) is obtained with such a configuration of separate but electrically orthogonal send and receive coil portions as compared with a single coil array having coil elements that perform both transmit and receive functions.

Figure 6:
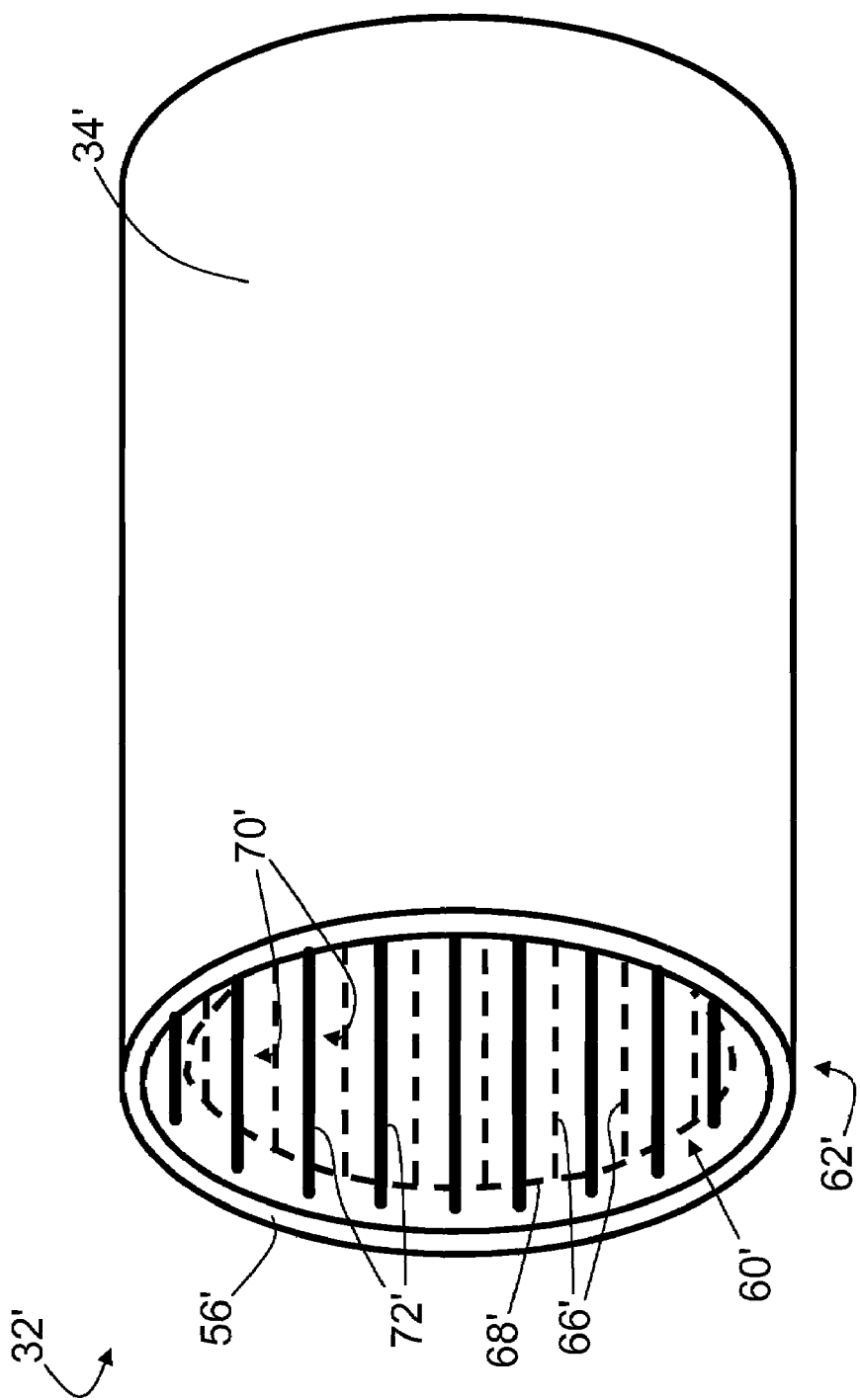
FIG. 6 shows a perspective view of yet another embodiment of the radio frequency coil of FIG. 2.

With reference to FIG. 6, another example radio frequency coil assembly 32' has substantially the same electrical structure as the coil 32, and includes degenerate birdcage coil and TEM portions 60', 62', respectively. The degenerate birdcage coil portion 60' includes a plurality of parallel rungs 60' and transverse end ring elements 68'. The TEM coil portion 62' includes parallel rods 72' and a radio frequency screen 34'. Each pair of neighboring rungs 66' along with portions of the transverse elements 68' between those neighboring rungs define a birdcage mesh loop 70' that is substantially decoupled from the other birdcage mesh loops 70' of the birdcage coil portion 60'. The physical structure of the coil 32' differs from that of the coil 32 in that a generally cylindrical dielectric former 56' supports the rods 72' of the TEM coil portion 62' on its inner surface, and supports the radio frequency screen 34' on the outer surface of the dielectric former 56'. For example, the radio frequency screen 34' can be a porous electrically conductive film or mesh disposed on the outside surface of the dielectric former 56', and the rods 72' can be striplines disposed on the inner surface of the dielectric former 56'. In the coil 32' of FIG. 6, the birdcage coil portion 60' is not supported by the dielectric former 56', but rather is supported on a separate former or is a free-standing rigid conductive structure, for example having rigid copper rods and rungs.

The illustrated radio frequency coils are examples. Substantially any radio frequency coil manufacturing technique can be used to manufacture radio frequency coils with a combined array portion of coil loops and TEM coil portion such as are disclosed herein. For example, stripline technology can be used to make the some or all of the rings, rungs, or rods, some or all of the other rings, rungs, or rods can be rigid copper structures, and so forth. Moreover, individual elements can have different diameters or lengths with respect to each other, or can gradually change length from neighboring rung or rod to next neighboring rung or rod, for example to define openings that accommodate a shoulder or other anatomical feature.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A radio frequency coil configured for magnetic resonance imaging, the radio frequency coil comprising:

a coil array portion including a plurality of decoupled coil loops; and a TEM coil portion including a plurality of rods coupled with a radio frequency screen, currents in each rod of the TEM coil portion being electromagnetically orthogonal to currents in a corresponding coil loop of the coil array portion.

2. The radio frequency coil as set forth in claim 1, wherein each rod of the TEM coil portion is substantially spatially aligned with the corresponding coil loop of the coil array portion.

3. The radio frequency coil as set forth in claim 1, wherein the coil array portion includes:
a degenerate birdcage coil portion including a plurality of parallel rungs and transverse conductive elements, each coil loop being defined by a birdcage mesh loop including two neighboring rungs and connecting portions of the transverse conductive elements, the rods of the TEM coil portion being arranged parallel with the rungs of the birdcage coil portion.

4. The radio frequency coil as set forth in claim 3, wherein each rod of the TEM coil portion is arranged between the two neighboring rungs of the corresponding mesh loop of the degenerate birdcage coil portion.

5. The radio frequency coil as set forth in claim 3, further including:
a cylindrical electrically insulating former, the rungs and transverse conductive elements of the degenerate birdcage coil portion being disposed inside of the cylindrical electrically insulating former, the rods of the TEM coil portion being disposed outside of the cylindrical electrically insulating former.

6. The radio frequency coil as set forth in claim 5, wherein the transverse conductive elements of the degenerate birdcage coil portion are rings, and the degenerate birdcage coil portion is substantially cylindrical.

7. The radio frequency coil as set forth in claim 5, wherein at least one of the degenerate birdcage coil portion and the TEM coil portion includes striplines disposed on the cylindrical electrically insulating former.

8. The radio frequency coil as set forth in claim 3, wherein the TEM coil portion is substantially cylindrical and further includes:
a cylindrical electrically insulating former, the rods of the TEM coil portion being supported inside of the cylindrical electrically insulating former, the radio frequency screen being supported outside of the cylindrical electrically insulating former.

9. The radio frequency coil as set forth in claim 8, wherein the rods of the TEM coil portion include striplines disposed on an inside surface of the cylindrical electrically insulating former.

10. The radio frequency coil as set forth in claim 1, wherein the coil array portion is tuned to a first magnetic resonance frequency and the TEM coil portion is tuned to a second magnetic resonance frequency different from the first magnetic resonance frequency.

11. The radio frequency coil as set forth in claim 10, wherein the first and second magnetic resonance frequencies are selected from a group consisting of a $^1$H magnetic resonance frequency, a $^{13}$C magnetic resonance frequency, a $^{15}$N magnetic resonance frequency, and a $^{19}$F magnetic resonance frequency.

12. The radio frequency coil as set forth in claim 1, wherein the coil array portion and the TEM coil portion are both tuned to the same resonance frequency.

13. The radio frequency coil as set forth in claim 1, wherein one of the coil array portion and the TEM coil portion provides radio frequency shimming for the other one of the coil array portion and the TEM coil portion.

14. The radio frequency coil as set forth in claim 1, further including:
decouplers connected between the coil array portion and the TEM coil portion, the decouplers compensating for stray coupling between the coil array portion and the TEM coil portion.

15. A radio frequency system configured for use in magnetic resonance, the radio frequency system including:
a radio frequency transmitter;
a radio frequency receiver; and
a radio frequency coil as set forth in claim 1, the radio frequency transmitter being coupled with one of the coil array portion and the TEM coil portion, the radio frequency receiver being coupled with one of the coil array portion and the TEM coil portion.

16. The radio frequency system as set forth in claim 15, wherein the radio frequency receiver is coupled with the coil array portion and the radio frequency transmitter is coupled with the TEM coil portion.

17. The radio frequency system as set forth in claim 16, wherein the coil array portion is disposed inside of the TEM coil portion.

18. The radio frequency system as set forth in claim 15, wherein the radio frequency transmitter includes separate transmit channels for independently driving each rod of the TEM coil portion.

19. The radio frequency system as set forth in claim 15, wherein the coil array portion is a phased receive coil array in which a separate receive channel of the radio frequency receiver is coupled with each coil loop of the coil array portion.

20. The radio frequency system as set forth in claim 15, wherein the radio frequency transmitter includes fewer transmit channels than then number of rods of the TEM coil portion, the radio frequency system further including:
combiner circuitry corresponding to each transmit channel for driving a plurality of rods at different phases using that transmit channel.

21. A magnetic resonance imaging system including:
a main magnet for producing a main magnetic field in an examination region;
magnetic field gradient coils for superimposing selected magnetic field gradients on the main magnetic field in the examination region;
a radio frequency transmitters;
a radio frequency receiver; and
a radio frequency coil as set forth in claim 1, the radio frequency transmitter being coupled with one of the coil array portion and the TEM coil portion, the radio frequency receiver being coupled with one of the coil array portion and the TEM coil portion.

* * * * *